United States Patent
Thieme et al.

(10) Patent No.: US 11,620,101 B2
(45) Date of Patent: Apr. 4, 2023

(54) DYNAMIC AUDIO EQUALIZATION

(71) Applicant: Harley-Davidson Motor Company Group, LLC, Milwaukee, WI (US)

(72) Inventors: Bryan Thieme, Colgate, WI (US); Thomas E. Strunsee, Waukesha, WI (US); Jack Postuchow, Allenton, WI (US); Judson Riggins, Milwaukee, WI (US); Justin Zazzi, Tempe, AZ (US); Erik Gundersen, Gilbert, AZ (US)

(73) Assignee: Harley-Davidson Motor Company Group, LLC, Milwaukee, WI (US)

(*) Notice: Subject to any disclaimer, the term of this patent is extended or adjusted under 35 U.S.C. 154(b) by 11 days.

(21) Appl. No.: 17/383,706

(22) Filed: Jul. 23, 2021

(65) Prior Publication Data

US 2023/0028807 A1    Jan. 26, 2023

(51) Int. Cl.
| | |
|---|---|
| *H03G 5/00* | (2006.01) |
| *G06F 3/16* | (2006.01) |
| *H04R 3/00* | (2006.01) |
| *B62J 45/10* | (2020.01) |
| *B62J 45/20* | (2020.01) |
| *H03G 3/30* | (2006.01) |
| *H03G 3/00* | (2006.01) |

(52) U.S. Cl.
CPC .............. *G06F 3/165* (2013.01); *B62J 45/10* (2020.02); *B62J 45/20* (2020.02); *H03G 3/3005* (2013.01); *H04R 3/00* (2013.01); *H04R 2499/13* (2013.01)

(58) Field of Classification Search
CPC .......... G06F 3/165; B62J 45/20; B62J 45/10; H03G 3/3005; H04R 3/00; H04R 2499/13

USPC .................................................. 381/103, 104
See application file for complete search history.

(56) References Cited

U.S. PATENT DOCUMENTS

| | | | |
|---|---|---|---|
| 4,558,460 A | 12/1985 | Tanaka et al. | |
| 6,298,305 B1 | 10/2001 | Kadaba et al. | |
| 7,118,005 B2 | 10/2006 | Shimazaki | |
| 7,583,807 B2 | 9/2009 | Enomoto et al. | |
| 7,606,376 B2 | 10/2009 | Eid et al. | |
| 8,121,307 B2 | 2/2012 | Yamaguchi | |
| 8,155,328 B2 | 4/2012 | Kotegawa et al. | |
| 8,204,243 B2 | 6/2012 | Smith | |
| 8,362,921 B2 | 1/2013 | Pan | |

(Continued)

FOREIGN PATENT DOCUMENTS

| | | |
|---|---|---|
| EP | 1067680 A2 | 1/2001 |
| JP | 0732948 A | 2/1995 |
| JP | 2006281965 A | 10/2006 |

*Primary Examiner* — Ammar T Hamid
(74) *Attorney, Agent, or Firm* — Michael Best & Friedrich LLP

(57) ABSTRACT

Methods and systems for performing automatic speed-based audio control. One method includes receiving, with an electronic control unit included in a vehicle, a speed of the vehicle and receiving, with the electronic control unit, an audio signal. The method also includes accessing, with the electronic control unit, a plurality of equalization curves based on the speed of the vehicle, each of the plurality of equalization curves associated with the speed of the vehicle and each of the plurality of equalization curves defining a gain adjustment for one of a plurality of frequencies, and, for each curve of the plurality of equalization curves, applying the gain adjustment defined by the curve to one of the plurality of frequencies of the audio signal.

18 Claims, 6 Drawing Sheets

(56) References Cited

U.S. PATENT DOCUMENTS

| | | |
|---|---|---|
| 8,718,298 B2 | 5/2014 | Prince |
| 9,118,290 B2 | 8/2015 | Christoph |
| 9,306,521 B2 | 4/2016 | Kikuchi et al. |
| 9,815,404 B2 | 11/2017 | Peachey et al. |
| 9,944,127 B2 | 4/2018 | Every et al. |
| 2005/0213776 A1 | 9/2005 | Honji et al. |
| 2006/0111827 A1 | 5/2006 | Russlies et al. |
| 2009/0103751 A1 | 4/2009 | Lenk et al. |
| 2011/0158428 A1* | 6/2011 | Hashizume ............... H03G 3/32 |
| | | 381/94.1 |
| 2012/0059574 A1* | 3/2012 | Hada .................... G08G 1/0112 |
| | | 701/119 |
| 2012/0308036 A1* | 12/2012 | Christoph ................ H03G 3/32 |
| | | 381/86 |
| 2020/0101896 A1* | 4/2020 | Bastyr ...................... B60Q 9/00 |

\* cited by examiner

DYNAMIC AUDIO EQUALIZATION

FIELD

Embodiments described herein generally relate to automatically adjusting audio signals in vehicular environments and, in particular, relate to performing speed-based audio equalization.

SUMMARY

Ambient noise in and around a vehicle can impact audio signals output by one or more speakers included in the vehicle and, in some situations, makes it difficult for a driver or passenger of the vehicle to hear the audio signals output via the speakers (e.g., radio or music output, telephone call output, vehicle feedback or other information output audibly (e.g., alarms, audio notifications, etc.), or the like). The amount of noise can vary with a speed of the vehicle, which can require a driver or passenger of the vehicle to repeatedly manually adjust a volume of the audio signals output via the speakers as the vehicle's speed changes.

As compared to passenger vehicles that include a closed interior passenger compartment, motorcycles can experience a greater noise impact. Also, requiring that a rider or passenger manually adjust an audio volume as the motorcycle's speed changes, can be more cumbersome and distracting for a motorcycle rider or passenger as compared to a driver or passenger in a passenger vehicle.

Accordingly, embodiments described in the present application provide systems and methods for automatically adjusting audio signals output via a speaker of a vehicle to account for speed-based noise associated with the vehicle. In particular, systems and methods described herein provide speed-based audio equalization that optimizes both sound quantity (i.e., volume) and quality at varying on-road speeds. One system includes a digital signal processor (DSP) located in a vehicle. The DSP receives user input (e.g., defining a level or amount of desired equalization) and vehicle input (e.g., defining a current speed) and uses the input to generate a dynamic equalization (DEQ) output. The DEQ output includes a linear gain increase (sound quantity adjustment) and a non-linear gain increase (sound quality adjustment, also referred to herein as the DEQ scaler). In some embodiments, the non-linear gain increase is based on empirical on-road noise response measurements associated with various vehicle speeds (e.g., from 15 to 80 miles-per-hour in 1 or 5 mile-per-hour increments). Accordingly, the noise response measurements (acquired in various testing environments) capture how noise affects different audio frequencies at different speeds, which can be used to establish a DEQ scaler as described herein to improve overall audio quality.

For example, one embodiment provides a method for performing automatic speed-based audio control. The method includes receiving, with an electronic control unit included in a vehicle, a speed of the vehicle and receiving, with the electronic control unit, an audio signal. The method also includes accessing, with the electronic control unit, a plurality of equalization curves based on the speed of the vehicle, each of the plurality of equalization curves associated with the speed of the vehicle and each of the plurality of equalization curves defining a gain adjustment for one of a plurality of frequencies, and, for each curve of the plurality of equalization curves, applying the gain adjustment defined by the curve to one of the plurality of frequencies of the audio signal.

Another embodiment provides an apparatus for performing automatic speed-based audio control. The apparatus includes a vehicle speed input configured to receive a speed of a vehicle, an audio input configured to receive an audio signal, a first equalization block associated with a first frequency, and a second equalization block associated with a second frequency. The first equalization block is configured to access a first equalization curve based on the speed of the vehicle, the first equalization curve associated with the speed of the vehicle and the first equalization curve defining a first gain adjustment for the first frequency, and apply the first gain adjustment defined by the first equalization curve to the first frequency of the audio signal. The second equalization block configured to access a second equalization curve based on the speed of the vehicle, the second equalization curve associated with the speed of the vehicle and the second equalization curve defining a second gain adjustment for the second frequency, and apply the second gain adjustment defined by the second equalization curve to the second frequency of the audio signal.

A further embodiment provides a system for performing automatic speed-based audio control. The system includes an electronic control unit included in a vehicle. The electronic control unit is configured to receive a speed of the vehicle and receive an audio signal from an audio source. The electronic control unit is also configured to access a plurality of equalization curves based on the speed of the vehicle, each of the plurality of equalization curves associated with the speed of the vehicle and each of the plurality of equalization curves defining a gain adjustment for one of a plurality of frequencies, and, for each curve of the plurality of equalization curves, applying the gain adjustment defined by the curve to one of the plurality of frequencies of the audio signal. The electronic control unit is further configured to output the audio signal to a speaker.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments and explain various principles and advantages of those embodiments.

Figure 1:
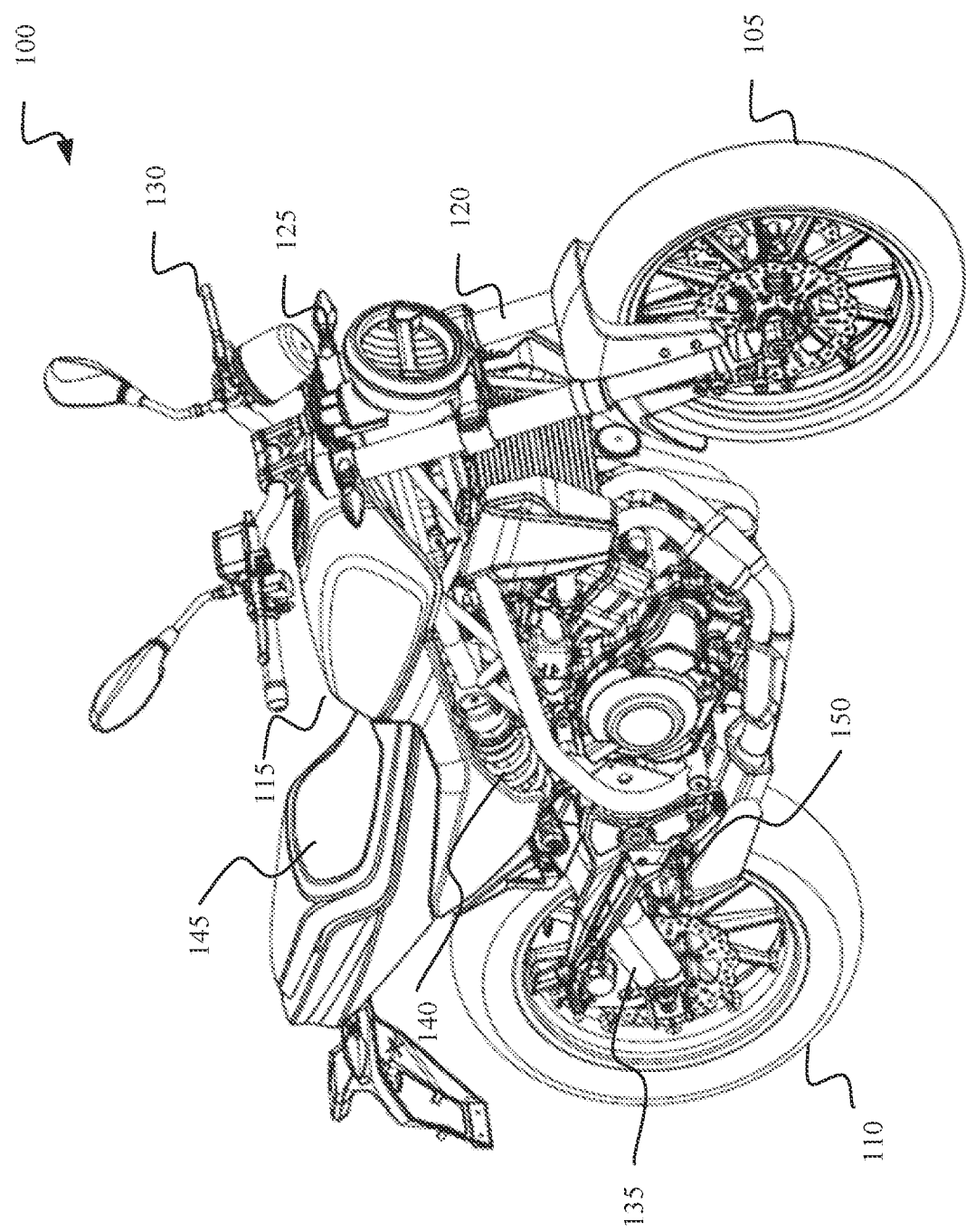
FIG. 1 is planar view of a motorcycle according to some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments provided herein. The apparatus and method components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

DETAILED DESCRIPTION

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not listed. Furthermore, some embodiments described herein may include one or more electronic control units or controllers. It will be appreciated that these electronic control units or controllers may be comprised of one or more generic or specialized electronic processors, such as, for example, microprocessors, digital signal processors, customized processors, and field programmable gate arrays (FPGAs) and unique stored program instructions (including both software and firmware) that control the one or more electronic control units or controllers to implement the functionality described herein.

Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a ROM (Read Only Memory), a RAM (Random Access Memory), register memory, a processor cache, or any combination thereof.

In addition, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. Moreover, relational terms such as first and second, top and bottom, and the like may be used herein solely to distinguish one entity or action from another entity or action without necessarily requiring or implying any actual such relationship or order between such entities or actions.

As described above, embodiments described in the present application provide systems and methods for automatic speed-based audio signal equalization. Embodiments are described herein with respect to a motorcycle. However, it should be understood that the components and associated functionality described herein are not limited to motorcycles but can be used in any type of vehicle (e.g., a moped, an electric bicycle, a three-wheeled vehicle, a passenger vehicle, a semi-truck, etc.) as well as any type of variable-speed machine associated with one or more audio outputs (e.g., an industrial machine that operates at various on-road speeds).

FIG. 1 is a planar view of a motorcycle 100 according to some embodiment. The motorcycle 100 includes front and rear wheels 105, 110 (e.g., a single front wheel 105 and a single rear wheel 110 aligned with the front wheel 105 to define a single track). The motorcycle 100 also includes a frame structure having a main frame 115. A front fork 120 supports the front wheel 105 ahead of the main frame 115. The front fork 120 is rotatably coupled to a head tube 125 of the main frame 115. Handlebars 130 are coupled to the front fork 120 to allow a rider to control the orientation of the front fork 120 and the front wheel 105. A rear swingarm 135 supports the rear wheel 110 for rotation therein. The rear swingarm 135 enables pivoting suspension movements of the rear wheel 110 and the swingarm 135 together relative to the main frame 115. In addition to the pivoting support, the swingarm 135 is coupled to the main frame 115 through a shock absorber unit 140 (e.g., including a coil spring and a hydraulic damper). The motorcycle 100 further includes at least one seat 145 (e.g., a saddle seat for a rider and, optionally, a pillion for a passenger) and at least one set of foot supports 150 (e.g., laterally extending foot pegs).

Figure 2:
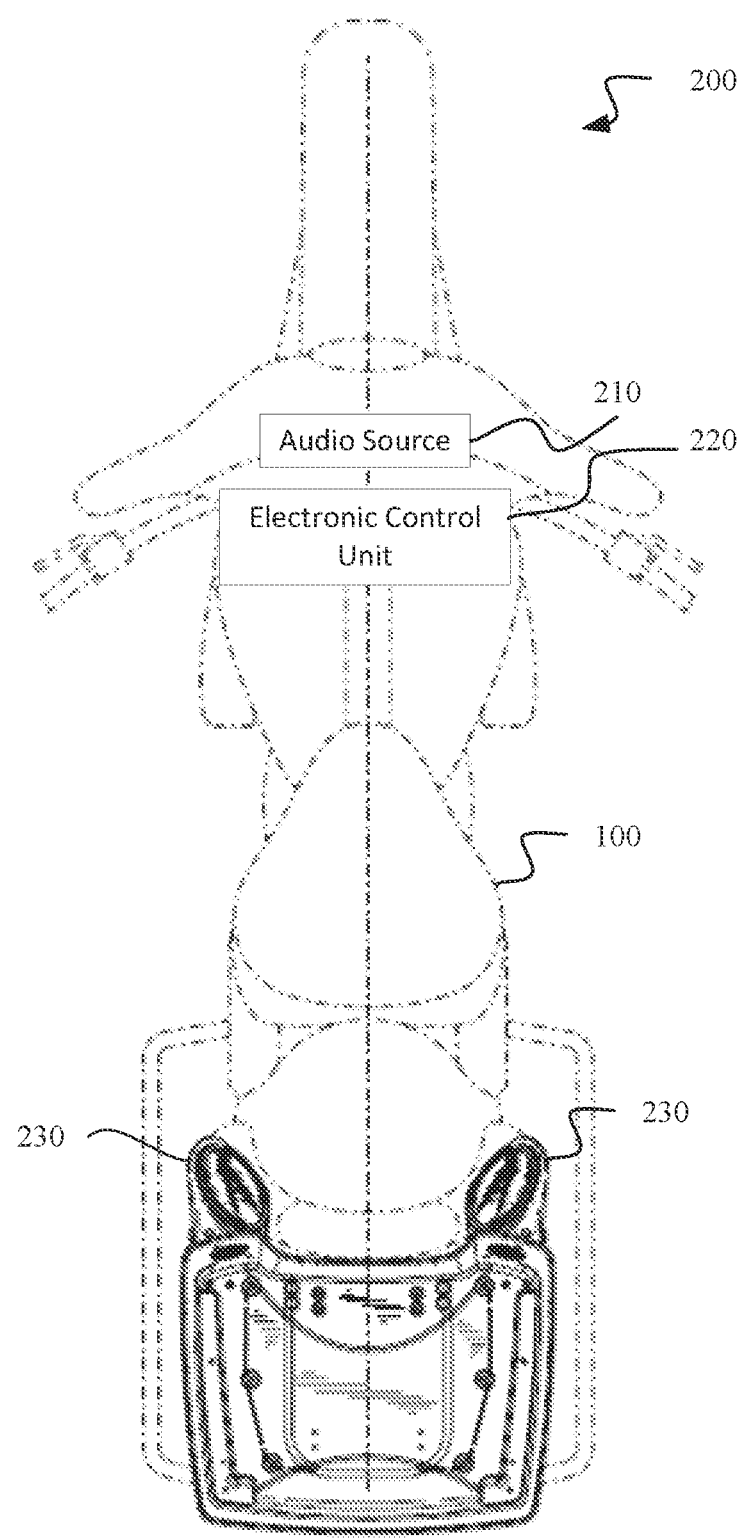
FIG. 2 is an aerial view of the motorcycle of FIG. 1 schematically illustrating a dynamic equalization system according to some embodiments.

As illustrated in FIG. 2, the motorcycle 100 is associated with a dynamic equalization (DEQ) system 200. The DEQ system 200 includes an electronic control unit (ECU) 220, an audio source 210, and one or more speakers 230. The ECU 220, the audio source 210, and the speakers 230 communicate over one or more wired connections, wireless connections, or a combination thereof using various communication types and protocols. The ECU 220, the audio source 210, and the speakers 230 may also communicate or interface with other components and may be distributed or arranged in various configurations. For example, in some embodiments, the ECU 220 is included in the audio source 210, one of the speakers 230, or another component of the vehicle (e.g., an amplifier). Similarly, in some embodiments, the speakers 230 are included in the audio source 210. Also, in some embodiments, the ECU 220 communicates with a vehicle communication bus and a user interface as described below.

The audio source 210 may include a radio receiver, a music player, a wireless audio device (e.g., a Bluetooth-connected audio device providing speaker phone functionality for telephone calls, providing music played via a device separate from the motorcycle 100, or the like), or other audio output device that can send audio signals to drive the speakers 230. For example, in some embodiments, the motorcycle 100 can be configured to provide audio feedback to rider, such as navigation signals, alerts or warnings, or the like and the source of such signals can be the audio source 210 described herein. In some embodiments, the audio source 210 outputs right and left audio signals (e.g., for output via a right and left speaker 230, respectively). However, in other embodiments, the audio source 210 may output fewer or additional audio signals that can be processed via the ECU 220 as described herein. It should be understood that although the audio source 210 is illustrated in FIG. 2 as being included in the motorcycle 100, in some embodiments, the audio source 210 is not included in the motorcycle 100 but communicates with the ECU 220. For example, as noted above, the audio source 210 may be provided as part of a mobile phone (e.g., carried by the rider)

that provides audio signals to the ECU 220 over one or more wired or wireless connections (e.g., via Bluetooth).

The one or more speakers 230 receive audio signals (as output by the audio signals and processed by the ECU 220 as described herein) and output the audio signals as sounds waves perceptible by the rider. As illustrated in FIG. 2, the speaker 230 can be included in the motorcycle 100. However, in other embodiments, one or more of the speakers 230 can be included in a device separate from the motorcycle 100, such as a portable device carried by the rider (e.g., a smart phone), a helmet, a jacket, or the like. Also, in some embodiments, the DEQ system 200 may include one or more amplifiers or other sound equipment not illustrated in FIG. 2.

In some embodiments, the ECU 220 is included in the motorcycle 100 and includes a digital signal processor (DSP) including dedicated processing circuitry for receiving, processing, and outputting audio signals as described herein. It should be understood that the functionality described herein as being performed via the ECU 220 may be distributed among of a plurality of devices, such as, for example, a plurality of electronic control units. Furthermore, in some embodiments, the ECU 220 performs additional functionality than the functionality described herein. Also, in some embodiments, the ECU 220 includes a different type of electronic processor than a DSP, such as a microprocessor, a field programmable gate arrays (FPGAs), or the like.

Figure 3:
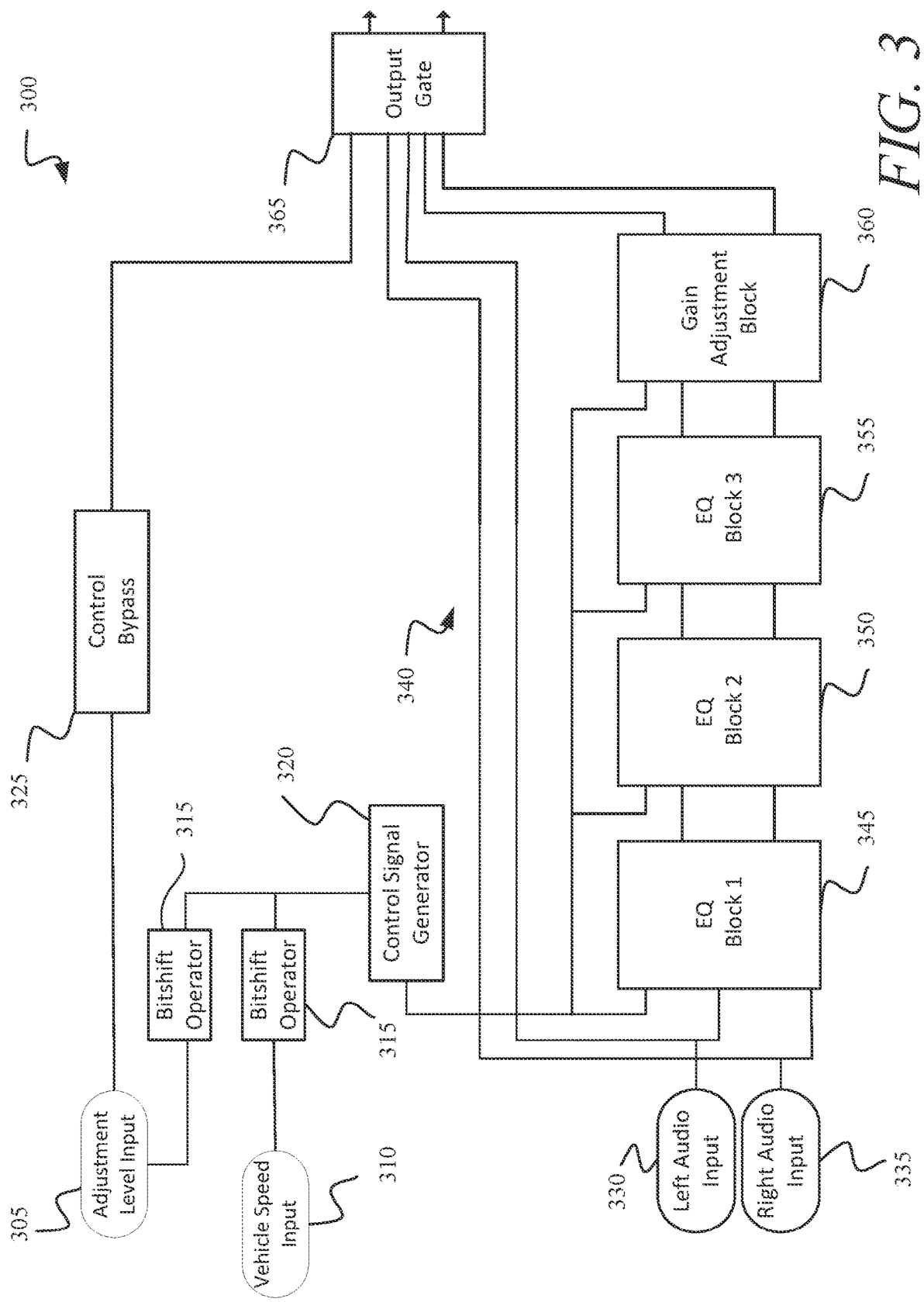
FIG. 3 schematically illustrates circuitry included in the dynamic equalization system of FIG. 2 according to some embodiments.

FIG. 3 schematically illustrates circuitry 300 included in the DEQ system 200, such as within the ECU 220, according to some embodiments. As illustrated in FIG. 3, the circuitry 300 includes an optional adjustment level input 305. The input 305 receives a signal from a user interface included in the motorcycle 100 or the audio source 210 (e.g., a touch screen provided via a radio include in the motorcycle 100). The signal received at the adjustment level input 305 represents a desired level of audio adjustment. In some embodiments, the audio adjustment level may be selected from an "on" level or an "off" level (e.g., represented by signal values of "0" and "1" respectively). However, in other embodiments as described below, the audio adjustment level may include an "off" level and a plurality of "on" levels, wherein each "on" level represent a different level of adjustment (e.g., ranging from a minimum level of adjustment to a high or maximum level of adjustment). For example, in some embodiments, the signal received at the adjustment level input 305 has a value from 0 to 4, wherein a value of 0 represents an "off" level and the values 1 to 4 represent "on" levels with different levels of adjustments (e.g., level 1 providing a minimum level of adjustment and level 4 providing a maximum level of adjustment).

As illustrated in FIG. 3, the circuitry 300 also includes a vehicle speed input 310. At this input 310, the circuitry 300 receives a signal representing the current speed of the motorcycle 100. This signal may be received from one or more sensors (e.g., a wheel speed sensor, a rotation sensor, etc.) included in the motorcycle 100 or over a communication bus, such as a controller area network (CAN) bus included in the motorcycle 100. In some embodiments, the vehicle speed signal may be processed before reaching the vehicle speed input 310, such as to create an average speed over a predetermined time period or to round the speed signal to a nearest speed among a plurality of speed increments. For example, in some embodiments, a current vehicle speed is rounded to the nearest integer between a minimum and maximum value in predetermined increments, such as, for example, the nearest 5 mile-per-hour increment between 0 and 80 miles-per-hour. Using this type of rounding, the current speed can be presented as an integer value between 0 and 16, which as described below, can be used to identify one of 17 available curves applied by an equalization block. In should be understood that this processing of the vehicle speed can be performed separate from the circuitry 300 (e.g., before a signal is received at the input 310), via the circuitry 300 (e.g., at the input 310), or a combination thereof.

As illustrated in FIG. 3, the signals received at the adjustment level input 305 and the vehicle speed input 310 are processed via a bitshift operator 315. In some embodiments, each input 305 and 310 is associated with a dedicated bitshift operator 315 as illustrated in FIG. 3. Alternatively, the same bitshift operator 315 may be used with both inputs 305 and 310. The bitshift operators 315 move digits (in a binary representation) within the signals received at the inputs 305 and 310 left or right, which places the signals in a condition to be combined into a single control signal via a control signal generator 320 (described below), wherein the control signal generator 320 outputs a combined control signal to each of a plurality of equalization blocks 345, 350, and 355 as well as a gain adjustment block 360.

For example, in some embodiments, each bitshift operator 315 shifts the input signal to decimal so that the signals can be multiplied together to create a combined control signal. In particular, as illustrated in FIG. 3, the control signal generator 320 receives the signals received from the inputs 305 and 310 (as processed via the optional bitshift operators 315), multiplies the signals together, applies a scale effect that shifts the product of the multiplication from having a value from 0 to 64 to a value from 0 to 16, and performs an additional bitshift operation to shift bits to a format (e.g., an integer range) acceptable by the equalization blocks 345, 350, and 355 and the gain adjustment block 360. In this configuration, multiplying the input signals together creates a single control signal for the blocks 345, 350, 355, and 360 that represents both the current vehicle speed and the desired adjustment level. For example, multiplying the current vehicle speed by the scalar value representing the desired adjustment level (e.g., 0 through 4) effectively increases the "current" vehicle speed, which ultimately increases an amount of adjustment applied via the equalization blocks 345, 350, and 355. As one example, when the adjustment level input has a value of zero (i.e., no dynamic equalization is desired by the user), the current vehicle speed received by the control signal generator 320 is multiplied by zero, which causes the combined control signal to be zero (effectively causing no adjustment to be applied by the equalization blocks 345, 350, and 355). As another example, when the adjustment level input has a value of 2, the current vehicle speed received by the control signal generator 320 is multiplied by the scalar value of 2 and the appropriate equalization curves is selected by the equalization blocks 345, 350, and 355 for this multiplied vehicle speed. In particular, since a vehicle generally experiences more ambient noise at higher speeds than at lower speeds, more of an adjustment is applied by the equalization blocks 345, 350, and 355 at higher speeds than at lower speeds. Accordingly, in the example where the desired adjustment level is set to 2, multiplying the actual, current vehicle speed by the scalar value of 2 effectively increases the amount of adjustment applied via the blocks 345, 350, and 355 (e.g., as compared to if the desired adjustment level had a value of 1).

In should be understood that other ways of generating a combined control signal can be used in place of or in addition to using the bitshift operators 315 and the components of the control signal generator 320 described above. Also, in some embodiments, separate controls signals can be used by the equalization blocks 345, 350, and 355 and the gain adjustment block 360, which eliminates the needs for a combined signal. However, in embodiments where separate control signals are used, the circuitry 300 may still be configured to process the signals received at the inputs 305 and 310 to format the signals for acceptance by the blocks 345, 350, 355, and 360.

Each of the plurality of equalization blocks 345, 350, and 355 receives the control signal from the control signal generator 320 and receives one or more audio signals (e.g., a left audio signal received at a left audio input 330 and a right audio signal received at a right audio input 335) from the audio source 210. Each block 345, 350, and 355 uses the received control signal to apply an equalization effect to the received audio signals (before passing the processed audio signals to the next block). For example, in some embodiments, each of the plurality of equalization blocks 345, 350, and 355 adjusts the gain of a particular frequency (or sub-range of frequencies) within the audio signals. For example, in some embodiments, each of the plurality of equalization blocks 345, 350, and 355 affects one frequency (e.g., block 345 affects 125 Hz, block 350 affects 1000 Hz, and block 355 affects 10000 Hz). It should be understood that additional or fewer equalization blocks can be used and the blocks can affect various frequencies and sub-ranges of frequencies.

Figure 4:
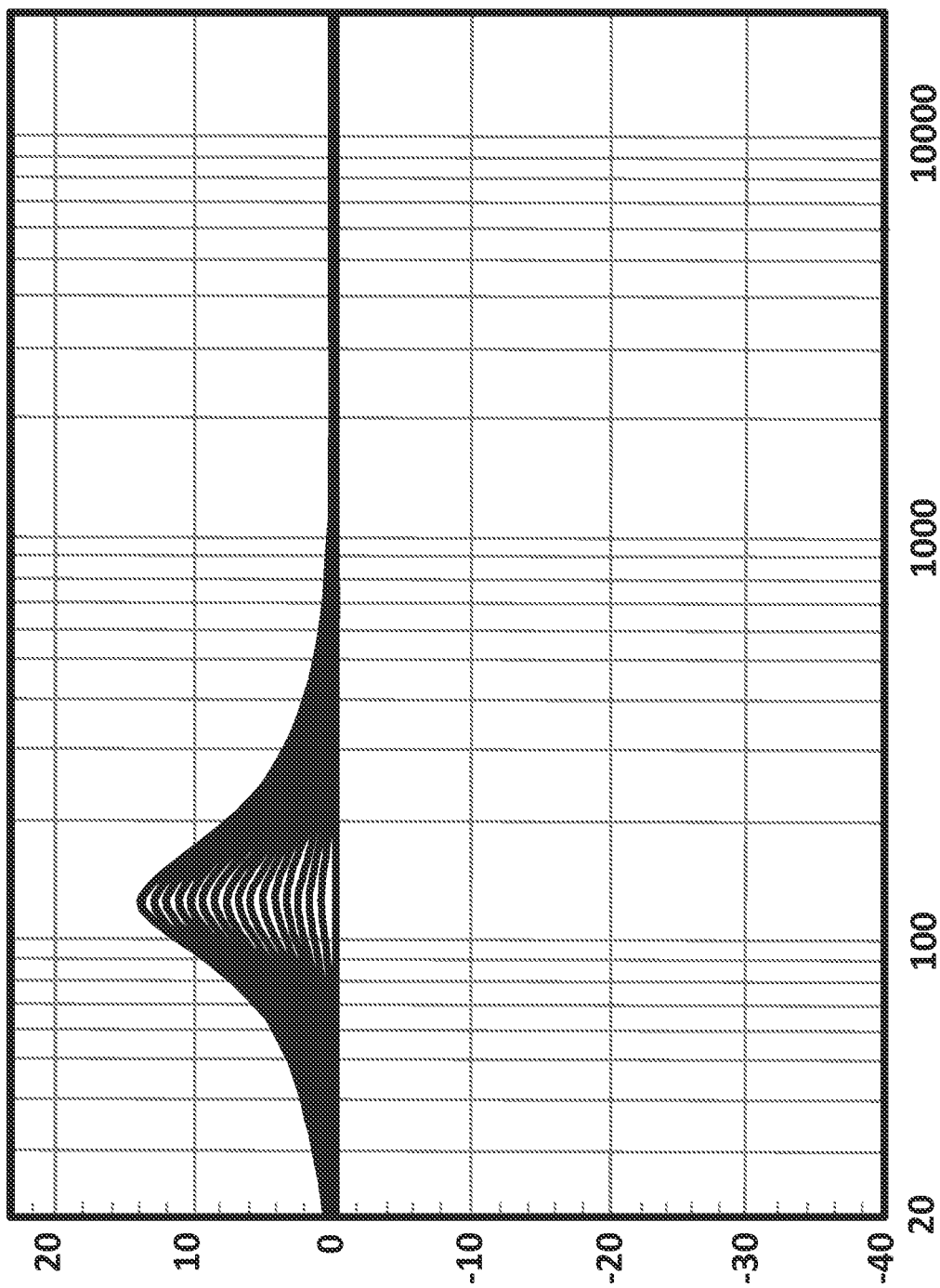
FIG. 4 illustrates example curves applied by an equalization block included in the circuitry of FIG. 3 according to some embodiments.

In some embodiments, each block 345, 350, and 355 accesses one of a plurality of equalization curves that define an equalization effect to be applied to an audio signal. Each curve can be associated with a particular vehicle speed. In particular, as noted above, when the vehicle speed is defined in 5 mile-per-hour increments between 0 and 80 miles-per-hour, the vehicle speed is effectively represented by one of 17 possible values (e.g., an integer from 0 to 16, where any speed over 80 miles per hour is represented via the integer value 16). In this embodiment, each equalization block 345, 350, and 355 can access one of 17 available curves based on the current speed specified via the control signal. FIG. 4 illustrates an example set of 17 curves used by one equalization block to apply an equalization effect at 125 Hz, wherein each of the 17 curves are associated with a particular vehicle speed (at 5 mile-per-hour increments between 0 and 80 miles per hour). The curves are illustrated on a graph where the x-axis represents frequency and the y-axis represents gain adjustment (e.g., decibels). Accordingly, as illustrated in FIG. 4, not only can different gain adjustments be associated with different vehicle speeds, but the separate curves for each of a plurality of frequencies allows a different gain to be applied to different frequencies within an audio signal. As noted above, since noise may affect different frequencies differently, the separate curves allow the DEQ system 200 to create an improved audio signal in terms of both volume and quality.

It should be understood that, as used in the present application, an "equalization curve" defines a gain adjustment value for at least one frequency. For example, as illustrated in FIG. 4, in some embodiments, an equalization curve includes a plurality of points, wherein each point defines a gain adjustment value for a frequency. For example, as illustrated in FIG. 4, each of the 17 equalization curves includes a plurality of points defining a gain adjustment values for frequencies between 20 Hz and 200,000 Hz. Because each of the 17 curves illustrated in FIG. 4 are associated with a particular frequency (i.e., 125 Hz), some of the points included in the curve have non-zero gain adjustment values (i.e., for a sub-range of the available frequencies including 125 Hz) while the remaining points have zero gain adjustment values. As also illustrated in FIG. 4, the points with non-zero values within the curve can have varying values. Accordingly, the equalization curves do not, in some embodiments, merely define a static gain for a particular frequency (or a frequency range) but can define different gains for different frequencies (e.g., within a particular sub-range of frequencies). It should be understood that the curves illustrated in FIG. 4 are just one example implementation for performing the dynamic equalization described herein. The curves, however, can take different forms or data structures, such as tables and even a single value, can be used to define a particular gain for at least one frequency. Accordingly, embodiments described herein are not limited to using equalization curves as illustrated in FIG. 4.

Similar to the equalization blocks 345, 350, and 355, the gain adjustment block 360 receives the control signal and the audio signals (i.e., as processed by the equalization blocks 345, 350, and 355). The gain adjustment block 360 applies an additional gain adjustment, such as, for example, a simple volume increase or gain to the received audio signals, which, in some embodiments, varies based on the control signal (i.e., the vehicle speed, the adjustment level, or both).

As illustrated in FIG. 3, an output gate 365 receives the output from the gain adjustment block 360. The output gate 365 also receives, as input, the audio signals received at the left audio input 330 and the right audio input 335 over an audio bypass route 340 within the circuitry 300. Over this route 340, the audio signals are not processed by the equalization blocks 345, 350, and 360 or the gain adjustment block 360. The output gate 365 also receives an input from a control bypass 325 and uses the input from the control bypass 325 to determine whether the audio signals received over the bypass route 340 or the audio signals received via the gain adjustment block 360 should be output. The audio signals output by the output gate 365 (representing, for example, an adjusted left audio signal and an adjusted right audio signal) can optionally be passed to other components of the ECU 220 (e.g., other sections of a DSP) and are ultimately passed to the speakers 230 or other sound equipment, such as one or more amplifiers.

For example, in some embodiments, the control bypass 325 receives the signal (representing an adjustment level) received at the adjustment level input 305 and includes logic configured to determine whether the adjustment level represents an "off" level where no audio adjustment should be applied to the audio signals. In particular, in some embodiments, the control bypass includes logic that compares the adjustment level to a predetermined value (e.g., "0") and outputs a value to the output gate 365 that designates whether the adjustment level is equal to the predetermined value. In some embodiments, the control bypass 325 may not be used. In this configuration, the output gate 365 may be configured to receive the adjustment level from the adjustment level input 305 and process the adjustment level directly to determine what audio signals to output.

Figure 5:
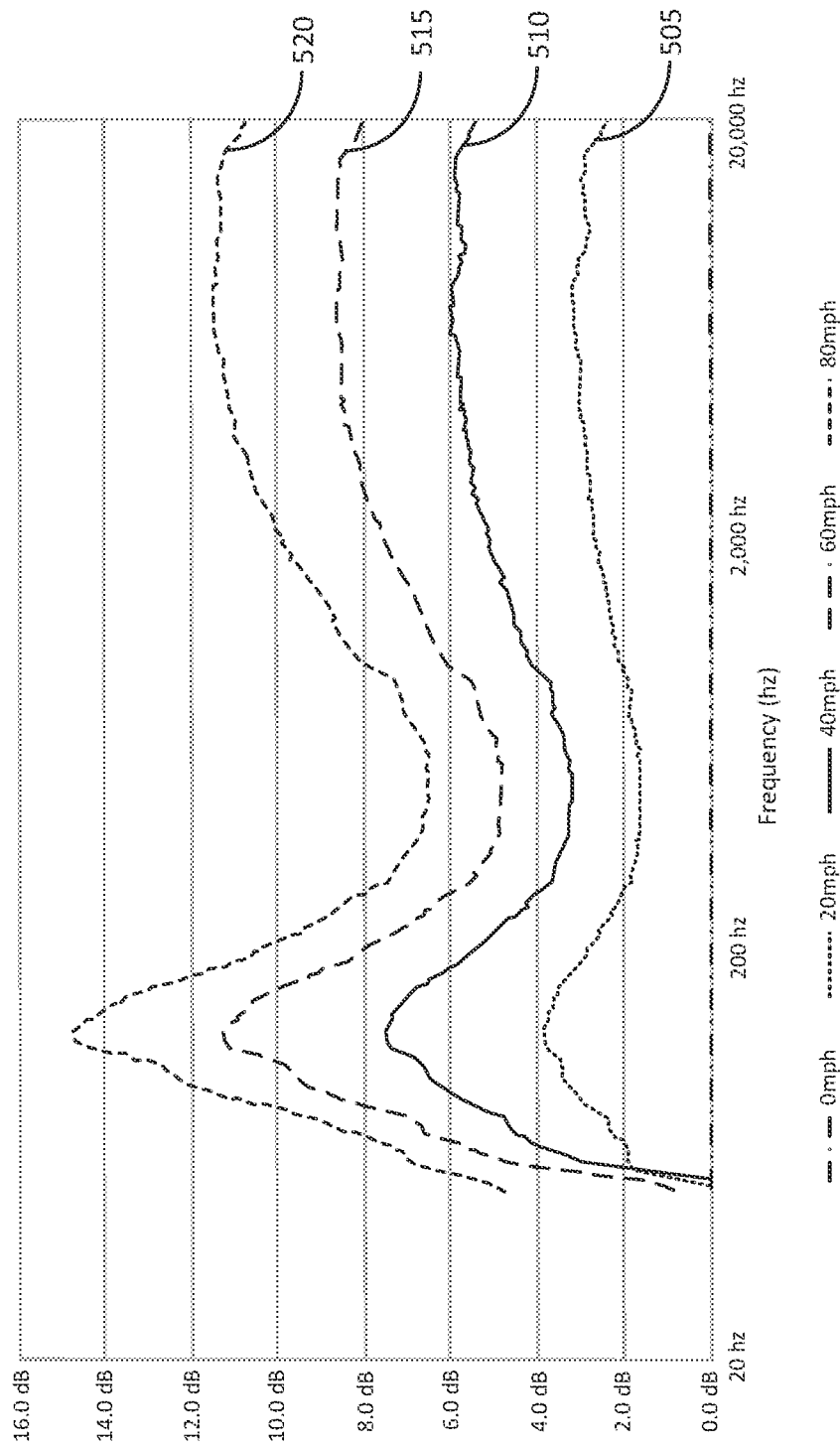
FIG. 5 illustrates example combined curves for a plurality of vehicle speeds according to some embodiments.

It should be understood that the circuitry 300 can include additional circuitry and can be configured in various ways. The configuration illustrated in FIG. 3 is provided as one example. For example, as noted above, fewer or additional equalization blocks can be used and various ways to generate one or more controls signals for the blocks and the gain adjustment block can be used based on the current vehicle speed and, optionally, a desired adjustment level. For example, in some embodiments, the circuitry 300 can include a single equalization block that effectively applies a combined curve (e.g., as compared to the individual curves for individual functions described above for the plurality of equalization blocks), wherein the combined curve is selected from one of a plurality of combined curves based on the current vehicle speed and each combined curve represents, for a particular vehicle speed, different gains to be applied for different frequencies. For example, FIG. 5 illustrates a set of combined curves, wherein each curve is associated with a particular vehicle speed (e.g., curve 505 is associated with a speed of 20 miles-per-hour, curve 510 is associated with a speed of 40 miles-per-hour, curve 515 is associated with a speed of 60 miles-per-hour, and curve 520 is associated with speed of 80 miles-per-hour). Each combined curve defines a gain for each of a plurality of frequencies, wherein the gains can differ for at least two of the plurality of frequencies.

Also, in some embodiments, the audio bypass route 340 can process the audio signals. For example, in some embodiments, the audio bypass route 340 includes a gain adjustment block (not shown) that applies a fixed increase in volume to all frequencies when the adjustment level is set to "off." This static gain block allows the rider to experience the full loudness of the audio source 210 even when the motorcycle 100 is standing still. Otherwise, due to the large amount of gain that the DEQ system 200 can apply, the audio source 210 may only achieve maximum loudness only when the motorcycle 100 is traveling at 80 miles-per-hour or more.

Figure 6:
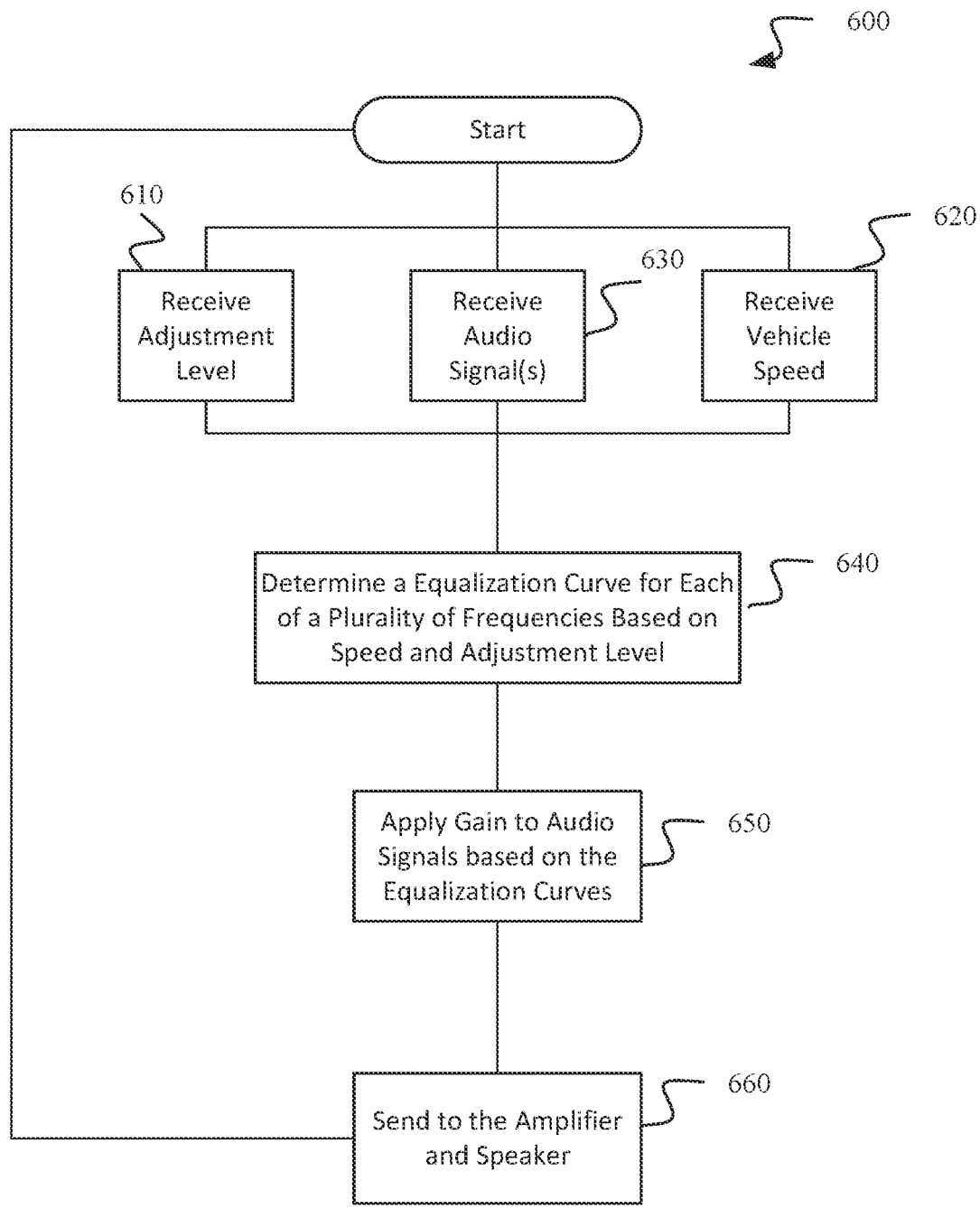
FIG. 6 is a flowchart illustrating a method of performing automatic speed-based audio control via the circuitry of FIG. 3 according to some embodiments.

FIG. 6 is a flowchart illustrating a method 600 of performing automatic speed-based audio control with the DEQ system 200 according to some embodiments. The method 600 is described herein as being performed by the ECU 220 (e.g., the circuitry 300) based on a speed of the motorcycle 100. However, as noted above, the functionality described herein can be distributed among multiple electronic devices and can be used with any type of vehicle or machinery that travels at variable speeds.

As illustrated in FIG. 6, the method 600 includes, optionally, receiving an adjustment level at the ECU 220 (e.g., at the input 305) (at block 610). As noted above, the adjustment level represents a level of sound adjustment to be applied by the DEQ system 200 and, in some embodiments, has a value from 0 to 4, where 0 represents an "off" level and values 1-4 represent different levels of adjustment (i.e., different strengths of adjustment) from a minimum adjustment (level 1) to a high or maximum adjustment (level 4). In this embodiment, adjustment levels 2 and 3 represent intermediate adjustments (between level 1 and level 4 adjustments), where a level 3 adjustment represents a higher level of adjustment than a level 2 adjustment. For example, in some embodiments, when the adjustment level has a value of 0, no automatic sound adjustment is performed as described herein and audio signals output via the audio source 210 are passed to the speakers 230. When the adjustment level has a value of 1, a minimum effect is applied. When the adjustment level is set to a value of 2, a medium effect is applied that has a higher effect or strength than the minimum effect. When the adjustment level has a value of 3, a strong effect is applied that has a higher effect or strength than the medium effect. When the adjustment level has a value of 4, a maximum effect is applied that has a higher effect or strength than the strong effect.

As noted above, in some embodiments, the ECU 220 receives the adjustment level from a user interface included in the motorcycle 100. For example, in some embodiments, the audio source 210 includes a radio that includes a user interface, such as a touchscreen, providing one or more inputs or selection mechanisms for accessing automatic sound adjustment settings and optionally selecting an adjustment level from a plurality of available adjustment levels. In other embodiments, the ECU 220 receives the adjustment level from a user interface included in a device separate from the motorcycle 100, such as from a mobile device carried by the rider. Also, in some embodiments, as compared to being set by a user, the adjustment level can be set to a default value. Similarly, in some embodiments, the adjustment level can be set based on operating conditions or parameters of the vehicle, such as, for example, a detected terrain the motorcycle 100 is operating on, an ambient temperature (which may impact how many layers the rider is wearing), an operating mode the motorcycle 100 is operating in (e.g., a sport mode, an economy mode, etc.), or the like. Accordingly, the ECU 220 may receive the adjustment level from various sources, including sources other than a user interface.

As illustrated in FIG. 5, the method 600 also includes receiving, at the ECU 220 (e.g., at the input 310), a current speed of the motorcycle 100 (at block 620). As noted above, the ECU 220 can receive the current speed of the motorcycle 100 from a sensor or over a communication bus or other communication network or connection within the motorcycle 100, such as over a CAN bus. The current speed of the motorcycle 100 can be an instantaneous speed, an average speed over a predetermined time period, or the like, and, as noted above, the current speed can be represented by an integer value between 0 and 16, wherein each integer value represents a 5 mile-per-hour increment. For example, when the current speed of the motorcycle is 35 miles-per-hour (e.g., rounded to the nearest 5 mile-per-hour increment), the current speed can be represented by the integer value of 7. It should be understood that other types of rounding can be used with the vehicle speed and, in some embodiments, larger or smaller increments may be used. Also, the increments may be defined in speed values other than miles-per-hour (e.g., kilometers-per-hour).

The method 600 also includes receiving, at the ECU 220 (e.g., via the inputs 330 and 335), one or more audio signals from the audio source 210 (at block 630). In some embodiments, the audio signals include a left audio signal and a right audio signal. As described above, the ECU 220 uses the vehicle speed and the optional adjustment level to access a plurality of equalization curves, wherein each of the plurality of equalization curves is associated with the current speed of the motorcycle 100 and wherein each of the plurality of equalization curves define a gain adjustment for one of a plurality of frequencies (at block 640). The ECU 220 uses the equalization curves to apply a gain to the one or more audio signals for each of a plurality of signal frequencies (at block 650). The adjusted audio signals are output to the one or more speakers 230 or one or more amplifiers (e.g., as adjusted left and right audio signals) (at block 660).

As described above with respect to FIG. 3, each of the plurality of equalization blocks 345, 350, and 355 included in the ECU 220 can be configured to select an appropriate curve based on the combined control generated by the control signal generator 320. In particular, each of the plurality of equalization blocks 345, 350, and 355 adjusts the gain of a particular frequency within the received audio signals by accessing one of a plurality of equalization curves that define an equalization effect to be applied to an audio signal, wherein each curve is associated with a particular vehicle speed. In some embodiments, the output of each block 345, 350, and 355 can be output to the next block, such that each block 345, 350, and 355 applies a gain adjustment to a different, particular frequency and wherein the output from block 355 includes an audio signal adjusted for each of plurality of frequencies (i.e., by blocks 345, 350, and 355). As noted above, in some embodiments, fewer or additional blocks can be used.

As also described above, the output from the block 355 is input to the optional gain adjustment block 360, which can apply a simple volume increase or gain to the received audio signals, which, in some embodiments, varies based on the control signal (i.e., the vehicle speed, the adjustment level, or both).

The output from the gain adjustment block 360, which can include an adjusted left audio signal and an adjusted right audio signal, is fed to the output gate 365. The output gate 365 also receives, as input, the audio signals over the audio bypass route 340 and an input from the control bypass 325. As described above, the output gate uses the input from the control bypass 325 (which indicates whether the automatic audio control provided by the DEQ system 200 is turned off) to decide whether to output, to the speakers 230, the audio signals received over the bypass route 340 or the audio signals received via the gain adjustment block 360.

Accordingly, the systems and methods described herein provide speed-based audio adjustments to account for ambient noise experienced by a vehicle, such as a motorcycle, at different speeds (e.g., as measured in various test environments). The audio adjustments do not merely adjust the overall volume (i.e., sound quantity) for audio signals but apply equalizations at a plurality of frequencies, which allows for both volume and sound quality to be adjusted to provide an improved audio output that accounts for the fact that different sound frequencies are effected by noise differently at different vehicle speeds.

Various features and advantages of some embodiments are set forth in the following claims.

We claim:

1. A method for performing automatic speed-based audio control, the method comprising:
    receiving, with an electronic control unit included in a vehicle, a first signal representing a speed of the vehicle;
    receiving, with the electronic control unit, a second signal representing a desired adjustment level;
    modifying the first signal representing the speed of the vehicle based on the second signal representing the desired adjustment level to create a combined control signal representing both the speed of the vehicle and the desired adjustment level;
    receiving, with the electronic control unit, an audio signal;
    accessing, with the electronic control unit, a plurality of equalization curves based on the combined control signal, each of the plurality of equalization curves defining a gain adjustment for one of a plurality of frequencies; and
    for each curve of the plurality of equalization curves, applying the gain adjustment defined by the curve to one of the plurality of frequencies of the audio signal.

2. The method of claim 1, wherein receiving the first signal representing the speed of the vehicle includes receiving a current speed of the vehicle rounded to a nearest predetermined speed increment.

3. The method of claim 1, wherein receiving the audio signal includes receiving the audio signal from a radio included in the vehicle.

4. The method of claim 1, wherein receiving the audio signal includes receiving the audio signal from a wireless audio device.

5. The method of claim 1, wherein receiving the second signal representing the desired adjustment level includes receiving a selection of one of at least three adjustment levels.

6. The method of claim 1, wherein modifying the first signal representing the speed of the vehicle based on the second signal representing the desired adjustment level to create the combined control signal includes multiplying the speed of the vehicle by a scalar value of the desired adjustment level to create the combined control signal.

7. The method of claim 1, further comprising applying an additional gain adjustment to the audio signal after applying the gain adjustment defined by each of the plurality of equalization curves.

8. An apparatus for performing automatic speed-based audio control, the apparatus comprising:
    a vehicle speed input configured to receive a first signal representing a speed of a vehicle;
    an adjustment level input configured to receive a second signal representing a desired adjustment level;
    a control signal generator configured to modify the first signal representing the speed of the vehicle based on the second signal representing the desired adjustment level to create a combined control signal representing both the speed of the vehicle and the desired adjustment level;
    an audio input configured to receive an audio signal;
    a first equalization block associated with a first frequency; and
    a second equalization block associated with a second frequency,
    the first equalization block configured to:
        receive the single control signal,
        access a first equalization curve based on the combined control signal, the first equalization curve defining a first gain adjustment for the first frequency, and
        apply the first gain adjustment defined by the first equalization curve to the first frequency of the audio signal,
    the second equalization block configured to:
        receive the single control signal,
        access a second equalization curve based on the combined control signal, the second equalization curve defining a second gain adjustment for the second frequency, and
        apply the second gain adjustment defined by the second equalization curve to the second frequency of the audio signal.

9. The apparatus of claim 8, wherein the speed of the vehicle represents a current speed of the vehicle rounded to a nearest predetermined speed increment.

10. The apparatus of claim 8, wherein the control signal generator is configured to modify the first signal representing the speed of the vehicle based on the second signal representing the desired adjustment level to create the combined control signal by multiplying the speed of the vehicle by a scalar value representing the desired adjustment level.

11. A system for performing automatic speed-based audio control, the system comprising:
    an electronic control unit included in a vehicle, wherein the electronic control unit is configured to:
        receive a first signal representing a speed of the vehicle,
        receive an audio signal from an audio source,
        access a plurality of equalization curves based on the speed of the vehicle, each of the plurality of equalization curves associated with the speed of the vehicle and each of the plurality of equalization curves defining a gain adjustment for one of a plurality of frequencies, wherein the plurality of equalization curves define both a linear gain increase and a non-linear gain increase and wherein at least one of the plurality of equalization curves associated with the speed of the vehicle includes a portion with a steeper slope than an equalization curve associated with a lower speed of the vehicle for the same frequency of the plurality of frequencies, for each curve of the plurality of equalization curves, applying the gain adjustment defined by the curve to one of the plurality of frequencies of the audio signal, and output the audio signal to a speaker.

12. The system of claim 11, wherein the vehicle is a motorcycle.

13. The system of claim 11, wherein at least one selected from a group consisting of the audio source and the speaker is included in the vehicle.

14. The system of claim 11, wherein the electronic control unit is further configured to receive a desired adjustment level, the desired adjustment level representing a selection of one of at least three adjustment levels.

15. The system of claim 14, wherein the electronic control unit is configured to access the plurality of equalization curves based on the speed of the vehicle and the desired adjustment level.

16. The system of claim 14, wherein the electronic control unit is further configured to generate a combined control signal by multiplying the speed of the vehicle by a scalar value of the desired adjustment level and wherein the electronic control unit is configured to access the plurality of equalization curves by accessing the plurality of equalization curves based on the combined control signal.

17. The method of claim 1, wherein modifying the first signal representing the speed of the vehicle based on the second signal representing the desired adjustment level to create the combined control signal includes increasing the speed of the vehicle based on the desired adjustment level.

18. The apparatus of claim 8, wherein the control signal generator is configured to modify the first signal representing the speed of the vehicle based on the second signal representing the desired adjustment level to create the combined control signal by increasing the speed of the vehicle based on the desired adjustment level.

* * * * *